US008994359B2

(12) United States Patent
Neti et al.

(10) Patent No.: US 8,994,359 B2
(45) Date of Patent: Mar. 31, 2015

(54) FAULT DETECTION BASED ON CURRENT SIGNATURE ANALYSIS FOR A GENERATOR

(75) Inventors: Prabhakar Neti, Rexford, NY (US); Manoj Ramprasad Shah, Latham, NY (US); Karim Younsi, Ballston Lake, NY (US); Mayank Tiwari, Bangalore (IN); Pinjia Zhang, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 557 days.

(21) Appl. No.: 13/219,753

(22) Filed: Aug. 29, 2011

(65) Prior Publication Data

US 2013/0049733 A1 Feb. 28, 2013

(51) Int. Cl.
*G01V 3/08* (2006.01)
*G01R 31/34* (2006.01)
*F03D 7/02* (2006.01)
*F03D 7/04* (2006.01)

(52) U.S. Cl.
CPC .......... *G01R 31/343* (2013.01); *F03D 7/0264* (2013.01); *F03D 7/0272* (2013.01); *F03D 7/042* (2013.01); *Y02E 10/723* (2013.01)
USPC ...................... 324/71.1; 324/76.11

(58) Field of Classification Search
USPC ............. 324/521, 522, 71.1, 76.11; 340/648; 702/35, 36
See application file for complete search history.

(56) References Cited

U.S. PATENT DOCUMENTS

| 4,435,770 | A | * | 3/1984 | Shiohata et al. ............... 702/56 |
| 7,677,869 | B2 | | 3/2010 | Martinez De Lizarduy Romo et al. |
| 2005/0284225 | A1 | | 12/2005 | Luo |
| 2009/0162186 | A1 | | 6/2009 | Christinsen et al. |
| 2010/0161245 | A1 | * | 6/2010 | Rai et al. ............... 702/35 |
| 2011/0018727 | A1 | * | 1/2011 | Bharadwaj et al. ........... 340/648 |

FOREIGN PATENT DOCUMENTS

WO 2009133161 A3 11/2009

OTHER PUBLICATIONS

Wei Zhou; "Bearing Fault Detection Via Stator Current Noise Cancellation and Statistical Control"; IEEE Transactions on Industrial Electronics, vol. 55, No. 12, Dec. 2008.

Shahin Hedayati Kia et al.; "Analytical and Experimental Study of Gearbox Mechanical Effect on the Induction Machine Stator Current Signature"; IEEE Transactions on Industry Applications, vol. 45, No. 4, Jul./Aug. 2009.

P. Caselitz et al; "IEEE Transactions on Industry Applications, vol. 45, No. 4, Jul./Aug. 2009"; IEEE Transactions on Industry Applications, vol. 45, No. 4, Jul./Aug. 2009; 4 Pages.

Yassine Amirat; "A Brief Status on Condition Monitoring and Fault Diagnosis in Wind Energy Conversion Systems"; Author manuscript, published in "Renewable and Sustainable Energy Reviews 3,9 (2009) 2629-2636" DOI : 10.10161j.rser.2009.06.031.

(Continued)

*Primary Examiner* — Vincent Q Nguyen
(74) *Attorney, Agent, or Firm* — Jason K. Klindtworth

(57) ABSTRACT

A method of detecting faults in a wind turbine generator based on current signature analysis is disclosed herein. The method includes acquiring a set of electrical signals representative of an operating condition of a generator. Further, the electrical signals are processed to generate a normalized spectrum of electrical signals. A fault related to a gearbox or bearing or any other component associated with the generator is detected based on analyzing the current spectrum.

18 Claims, 8 Drawing Sheets

(56) References Cited

OTHER PUBLICATIONS

Johann Zitzelberger et al; "Bearing Currents in Doubly-Fed Induction Generators"; EPE 2005—Dresden; ISBN: 90-75815-08-5; 9 Pages.

W. Yang et al.; "Condition monitoring and fault diagnosis of a wind turbine synchronous generator drive train"; URL : www.ietdl.org; The Institution of Engineering and Technology 2008; IET Renew. Power Gener., 2009, vol. 3, No. 1, pp. 1-11.

D. McMillan et al.; "Condition monitoring benefit for onshore wind turbines: sensitivity to operational parameters"; URL: www.ietdl.org; The Institution of Engineering and Technology 2008; IET Renew. Power Gener., 2008, vol. 2, No. 1, pp. 60-72.

Michael R. Wilkinson; "Condition Monitoring of Generators & Other Subassemblies in Wind Turbine Drive Trains"; 2007 IEEE; pp. 388-392.

Simon Jonathan Watson et al.; "Condition Monitoring of the Power Output of Wind Turbine Generators Using Wavelets"; IEEE Transactions on Energy Conversion, vol. 25, No. 3, Sep. 2010; pp. 715-721.

E. Al-Ahmar et al; "DFIG-Based Wind Turbine Fault Diagnosis Using a Specific Discrete Wavelet Transform"; Proceedings of the 2008 International Conference on Electrical Machines; 6 Pages.

M.R. Wilkinson et al.; "Extracting Condition Monitoring Information From a Wind Turbine Drive Train"; Universities Power Engineering Conference, 2004. UPEC 2004.; Publication Year: 2004; pp. 591-594.

J. Royo et al.; "Machine Current Signature Analysis as a Way for Fault Detection in Squirrel Cage Wind Generators"; 2007 IEEE; Diagnostics for Electric Machines, Power Electronics and Drives, 2007. SDEMPED 2007. IEEE International Symposium; Publication Year: 2007; pp. 383-387.

J. Xiang; "Practical Condition Monitoring Techniques for Offshore Wind Turbines"; European Wind Energy Conference (EWEC2008), Brussels, Belgium, Mar. 31,-Apr. 3, 2008; pp. 1-8.

Simon Watson et al.; "Real-Time Condition Monitoring of Offshore Wind Turbines"; Centre for Renewable Energy Systems Technology (CREST), Department of Electronic and Electrical Engineering,; In European Wind Energy Conference (Feb. 2006) Key: citeulike:7529164; 9 Pages.

Wenxian Yang et al.; "Research on a Simple, Cheap but Globally Effective Condition Monitoring Technique for Wind Turbines" Proceedings of the 2008 International Conference on Electrical Machines; 5 Pages.

X. Gong et al., "Incipient bearing fault detection via wind generator stator current and wavelet filter", IEEE Industrial Electronics Society, Piscataway, NJ, Nov. 7, 2010, pp. 2615-2620.

E. Al Ahmar et al., "Adavnced Signal Processing Techniques for Fault Detection and Diagnosis in a Wind Turbine Induction Generator Drive Train: A comparative Study," IEEE Energy Conversion Congress and Exposition, Sep. 12, 2010, pp. 3576-3581.

S. Watson et al., "Real-Time condition Monitoring of Offshore Wind Turbines," Centre for Renewable Energy Systems Technology (CREST), Department of Electronic and Electrical Engineering, http://www.supergen-wind.org.uk/Phase1/docs/Watson,%20Xiang-EWEC2006.pdf, Feb. 1, 2006, pp. 1-9.

S. J. Watson et al,"Condition Monitoring of the Power Output of Wind Turbine Generators Using Wavelets," IEEE Transactions on Energy Conversion, vol. 25, No. 3, Sep. 2010, pp. 715-721.

C.J. Crabtree et al., Condition Monitoring of a Wind Turbine DFIG by Current or Power Analysis, IEEE Power Electronics, Machines and Drives (PEMD 2010) , 5th IET International Conference Apr. 19-21, 2010, pp. 1-6.

B. Lu et al., "A Review of Recent Advances in Wind Turbine Condition Monitoring and Fault Diagnosis," IEEE Power Electronics and Machines in Wind Applications, Piscataway, NJ, Jun. 24, 2009, pp. 1-7.

Y. Amirat et al., "A brief status on condition monitoring and fault diagnosis in wind energy conversion systems," Renewable and Sustainable Energy Reviews Science Direct, vol. 13, No. 9, Dec. 1, 2009, pp. 2629-2636.

EP 12180667 Search Report, Dec. 17, 2012.

* cited by examiner

FAULT DETECTION BASED ON CURRENT SIGNATURE ANALYSIS FOR A GENERATOR

BACKGROUND

Embodiments of the invention relate generally to the monitoring of a condition of an electromechanical machine. Specifically, embodiments of the invention relate to a method and system for monitoring the condition of a drive-train system and bearing of an electromechanical machine based on current signal analysis (CSA).

Conventionally, the monitoring of mechanical abnormalities in electromechanical systems has been mainly performed using vibration signals. It has been observed that mechanical faults in the drive-train produce vibrations in radial rotor movement which in turn produce torque oscillations at the rotor mechanical rotating frequency. The monitoring and study of the rotor mechanical rotating frequency may lead to detecting mechanical faults associated with the drive-train system. However, condition monitoring using vibration signals has numerous disadvantages such as signal background noise due to external excitation motion, sensitivity to the installation position, and their invasive measurement nature.

Other condition monitoring techniques are based on the observation that the load torque oscillations cause the stator current to be phase modulated, whereby the stator current signature is analyzed for detecting mechanical perturbations due to fault. Such current monitoring techniques are receiving more and more attention in the detection of mechanical faults in electric machines since it offers significant economic savings and easy implementation. For example, in the case of bearing fault detection in electromechanical machines, bearing failures may be categorized into single-point defects or generalized roughness faults. The single-point defects have been detected by using motor current signal analysis (MCSA) with bearing mechanical characteristic frequencies and by considering these types of anomalies as eccentricity fault. However, for generalized roughness faults the characteristic bearing fault frequencies are not observable or may not exist, particularly at an early stage. In addition, irrespective of the type of fault, the bearing fault signatures are usually subtle compared to the dominant components in the sampled stator current such as the supply fundamental harmonics, eccentricity harmonics, and slot harmonics. Unlike bearing vibration monitoring, for which industry standards have been developed from long-time field experience, the field experience in stator current monitoring is limited, and significant difficulties exist. For example, the magnitude of bearing fault signatures may vary at different applications given that the bearing fault signatures in the stator current are already subtle. Further, gearbox monitoring using stator current signal analysis has been rarely proposed although gearboxes are widely used in industrial applications.

Therefore, there exists a need for an improved method and system for monitoring the condition of a drive-train system, specifically a gearbox and bearing, using current signature analysis.

BRIEF DESCRIPTION

In accordance with an embodiment of the invention, a method for detecting mechanical faults in a generator is provided. The method includes acquiring electrical signals representative of an operating condition of the generator. The method also includes normalizing the electrical signals to extract spectral information. The method further includes detecting a fault based on analyzing the spectral information.

In accordance with another embodiment of the invention, a system for detecting and bearing fault of a generator is provided. The system includes one or more sensors for acquiring electrical signals representative of an operating condition of the generator. The system also includes a controller for normalizing the electrical signals to extract spectral information. The system further includes a fault detection unit module for detecting one or more faults in the gearbox based on analyzing the extracted spectral information.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
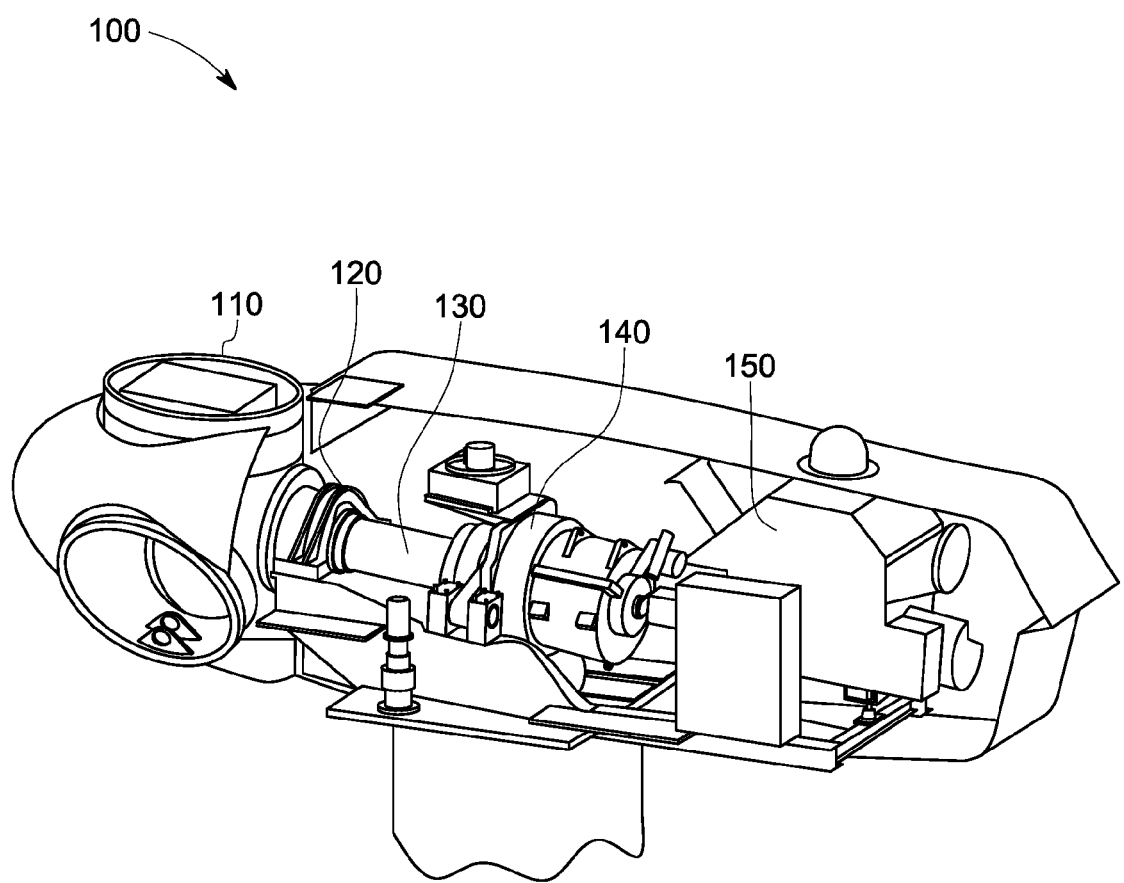
FIG. 1 is a schematic representation of an exemplary embodiment of an Electromechanical Machine (EMM) according to an embodiment of the invention.

An electrical multi-phase imbalance separation technique for high sensitivity detection of faults in an electromechanical machine (EMM) including drive-train abnormalities and bearing faults is described herein. The technique provides for differentiating a deteriorated EMM component's condition from normal or admissible conditions based on possibly subtle changes in the magnitude of fault signatures. The dominant components in the stator current of a typical electromechanical machine are the supply fundamental and harmonics, the eccentricity harmonics, the slot harmonics, the saturation harmonics, and other components from unknown sources including environmental noise. Since such dominant components exist before and after the presence of a bearing fault, a large body of the information they carry is not related to the bearing fault. In this sense, they are basically "noise" to the EMM fault detection problem. Comparatively, the components injected by a drive-train fault in the stator current have a much lower magnitude than those dominant components. Thus the sensitivity of detection suffers even with the best of instruments and analysis methods that are fundamentally based on individual phase analysis.

The frequency of the dominant components can be typically determined from the supply frequency, rotor speed, and machine structure. If drive-train fault signatures are considered as signal and those dominant components are considered as noise, then the drive-train fault detection problem is essentially a low signal-to-noise ratio problem. Further, since the frequency of the signal may not be predictable, the signal and noise may have identical frequencies. Thus, it is appropriate to remove the noise components to discover the fault signature. Thus, the dominant components that are not related to drive-train faults in the stator current are estimated and then cancelled by their estimates in a real-time fashion. By doing so, the remaining components (i.e. noise cancelled stator current) are more related to drive-train faults.

One embodiment of the invention provides for systematically and dynamically eliminating the contributions of the symmetrical or useful components of an electrical signal of a multi-phase system such as current, voltage, or power. Such elimination allows the "distortions" of the electrical signals caused by machine asymmetry and/or fault to get highlighted in the AC spectrum and thus make their detection much easier. More specifically, the method involves squaring the instantaneous values of an electrical signal (current, voltage, power, etc.) of each of the multiple phases and summing them. The squaring of the instantaneous values of an electrical signal 'folds' or adds all the symmetrical or balanced (and normally useful) component contributions into an equivalent DC signal. As a result, only unbalanced components in the signal, if any, indicating asymmetry or fault will show up as AC quantities at twice frequency. Thus, by such elimination of all symmetrical terms, the effects of abnormalities, be it inherent machine asymmetry, stator-winding fault, or drivetrain fault, or main bearing fault, stand out in the AC spectrum, as they do not have to compete with the useful or symmetrical components. Thus, the resulting AC spectrum that can be ascribed only to an abnormal condition is analyzed with a much higher level of sensitivity.

Referring to FIG. 1, an electromechanical machine (EMM), such as a 3-phase generator, is configured to generate power. The EMM assembly 100 includes a rotor assembly 110, a main bearing 120, a main shaft 130, a gearbox 140, electrical sensors (not shown), and a multi-phase generator 150. The EMM assembly 100 also includes a controller for monitoring and controlling the operation of the multi-phase generator 150 in response to generator fault conditions. The controller includes a processor for detecting the presence of a faulty condition of various components, including a drive-train system and bearing, within the EMM assembly 100. The controller will be discussed in greater detail with respect to FIG. 2. The electrical signal sensors may be current and voltage sensors for acquiring current and voltage data pertaining to the multi-phase generator 150. For example, the current sensor senses current data from one or more of the multiple phases of a multi-phase generator. More specifically, in the case of a 3-phase induction generator, the current and voltage sensors sense the current and voltage data from the three phases of the 3-phase induction generator. While certain embodiments of the present invention will be described with respect to a multi-phase generator, other embodiments of the present invention can be applied to other multi-phase electromechanical machines.

In one embodiment of the invention, the current and voltage sensors respectively detect stator current data from the multi-phase generator 150. The stator current data and voltage data acquired from the sensors is communicated to the controller, for further processing and analysis. The analysis includes performing current signature analysis (CSA) to detect faults within the EMM including drive-train and bearing faults. According to an embodiment of the invention, the controller is configured to eliminate the contributions of the symmetrical or useful components of an electrical signal so that, only unbalanced components in the signal relating to fault will show up as AC quantities in the AC spectrum. Particularly, the controller is programmed to remove such non-fault related symmetrical or useful components by squaring the instantaneous values of the current data for each of the multiple phases and summing the squared values. As a result, the non-fault related symmetrical components are transformed to DC quantities while the fault related asymmetrical components of the current signal show up in the AC spectrum at twice the frequency.

Figure 2:
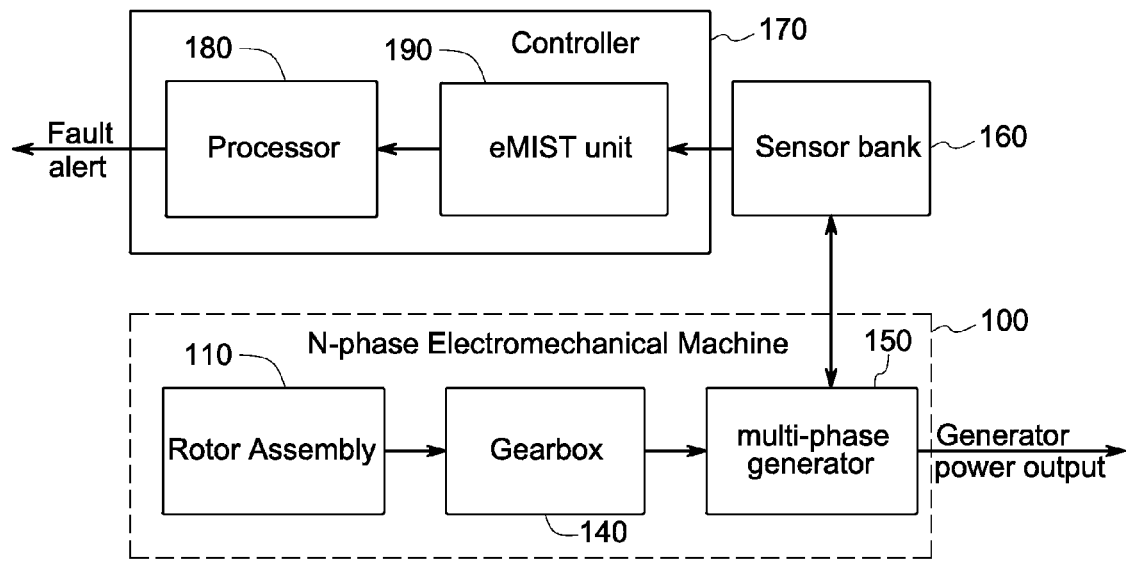
FIG. 2 is a block diagram representation of an exemplary fault detection system configuration in accordance with one embodiment.

Referring now to FIG. 2, a detailed block diagram of the controller is shown. As stated with respect to FIG. 1, controller 170 includes a processor 180 and an Electrical Multiphase Imbalance Separation technique (eMIST) unit 190. The eMIST unit 190 is connected to the sensor bank 160 and receives stator current and voltage data for each phase of the multi-phase generator 150 and prepares the current and voltage data for processing by the processor 180. The functions of the eMIST unit 190 will be described in greater detail with reference to FIGS. 3, 4, and 5. While the eMIST unit 190 is shown as a standalone component, it is also realized that the functions of the eMIST unit 190 could be performed by the processor 180.

The processor 180 functions as an imbalance separation system that systematically and dynamically eliminates the contributions of the symmetrical or useful components of an electrical signal of a multi-phase system such as current or voltage or power. Such elimination allows the "distortions" of the electrical signals caused by machine 100 asymmetry and/or fault to get highlighted in the AC spectrum. In other words, the processor 180 is configured to treat the fundamental frequency components as noise and the remaining frequency components as fault related components. Dynamically eliminating the noise components from continuously acquired stator current components yields purely fault related components which are injected into the stator current by the electromechanical faults. For example, the processor 180 may be programmed to eliminate the fundamental frequency (e.g., 60 Hz) and low frequency harmonics (especially the base frequency component) from the measured stator current data. The removal of the fundamental frequency from the measured stator current data can greatly improve the analog-to-digital conversion resolution and SNR, as the 60 Hz fundamental frequency has a large magnitude in the frequency spectrum of the current signal.

The processor 180 may be programmed to further analyze the noise cancelled stator current. Specifically, a threshold can be computed such that a measurement frequency falling outside the threshold indicates a deteriorated/abnormal EMM component condition. One approach to compute the threshold may be to find the highest level of fault signatures during normal conditions and set this value fixed as the threshold.

Figure 3:
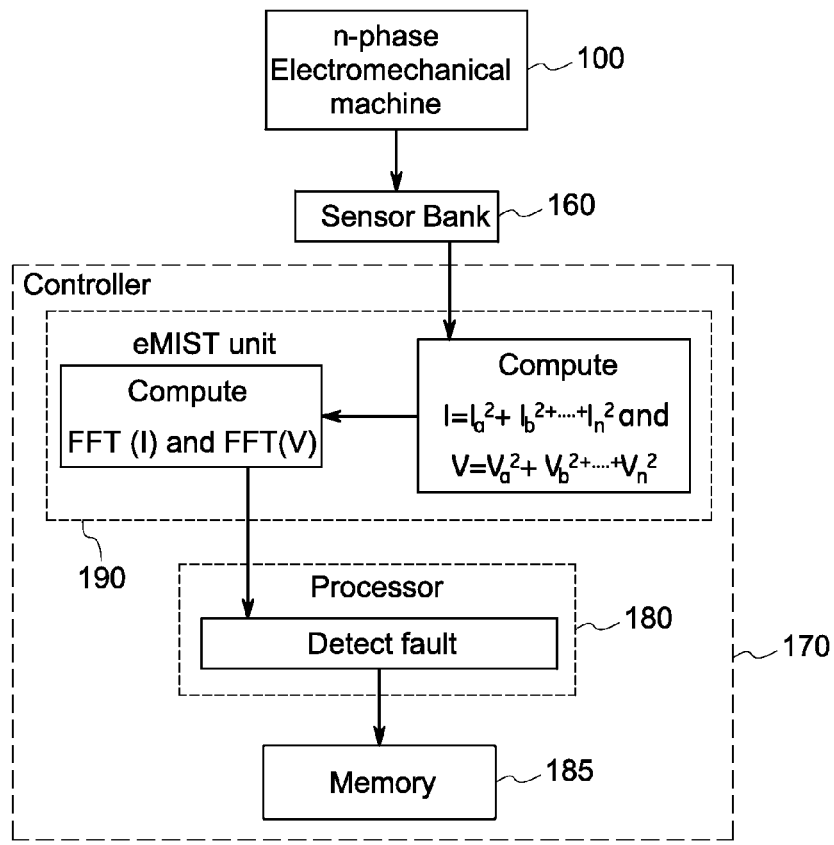
FIG. 3 is a block diagram representation of an exemplary fault detection system configuration in accordance with one embodiment.

Referring to FIG. 3, in an exemplary embodiment of the invention, the eMIST unit 190 provides for noise cancellation in the stator current and isolation of fault signal therein. To provide accurate noise cancellation in the stator current, the eMIST unit 190 is configured to dynamically eliminate the non-fault related, balanced components i.e., the noise components in the stator current. In order to dynamically eliminate noise components in the stator current spectrum, the eMIST unit 190 is configured to square the instantaneous values of an electrical signal (current, voltage, power, etc.) of each of the multiple phases and sum the squared instantaneous values, according to equations (1) and (2), so that the symmetrical or balanced (and normally useful) components get transformed into an equivalent DC quantity and any unbalanced, fault-related components appear at twice the frequency in the AC spectrum.

$$I = Ia^2 + Ib^2 + \ldots + In^2 \quad (1)$$

$$V = Va^2 + Vb^2 + \ldots + Vn^2 \quad (2)$$

As a result, only terms with any asymmetry show up as AC quantities in the AC spectrum for I and V. Thus, by this effective elimination of all symmetrical terms, the effects of abnormalities, be it inherent machine asymmetry or a drive-train component, or bearing fault, stand out in the AC spectrum as AC quantities. Thus, the resulting AC spectrum that can be ascribed only to an abnormal condition is analyzed for a faulty drivetrain or bearing condition with a much higher level of sensitivity. The processor 180 performs fault analysis on the results of equations (1) and (2) and detects a fault in the presence of any fault-related AC quantity in the AC spectrum.

Figure 4:
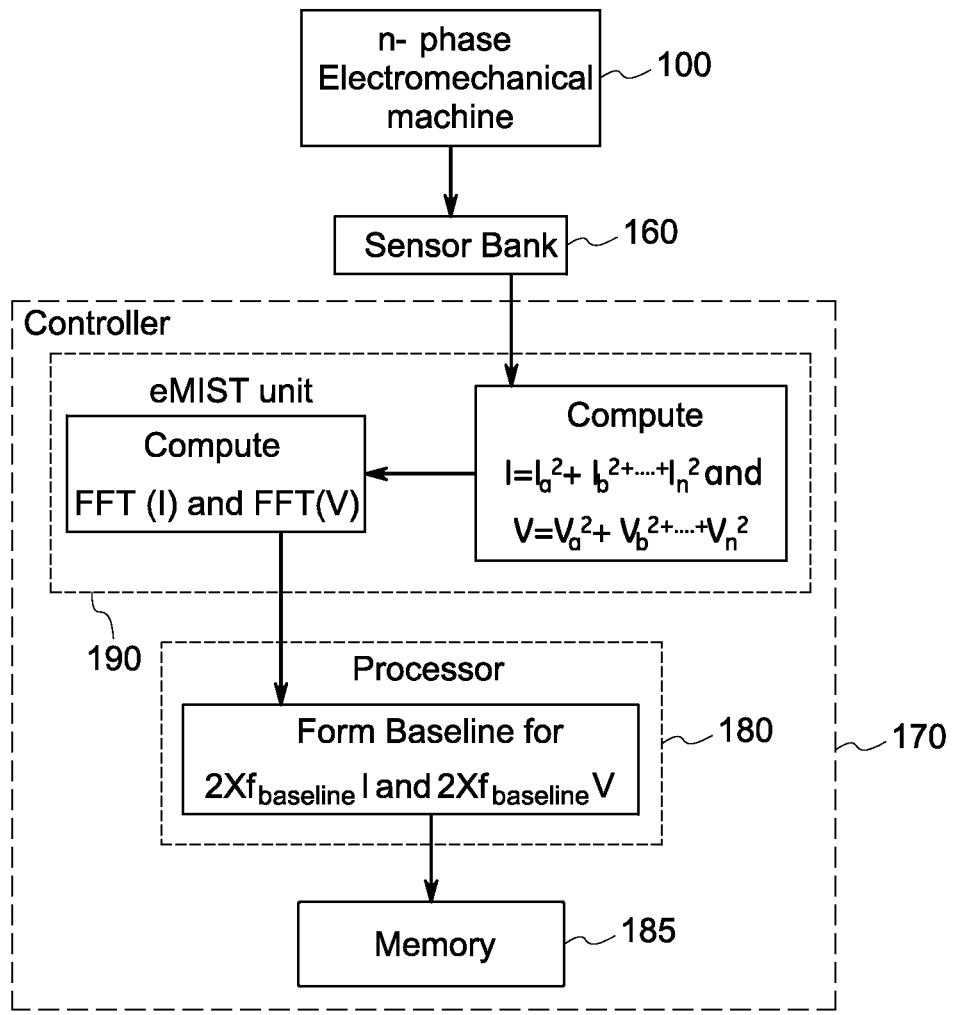
FIG. 4 is a block diagram representation of an exemplary fault detection system configuration in accordance with one embodiment.
Figure 5:
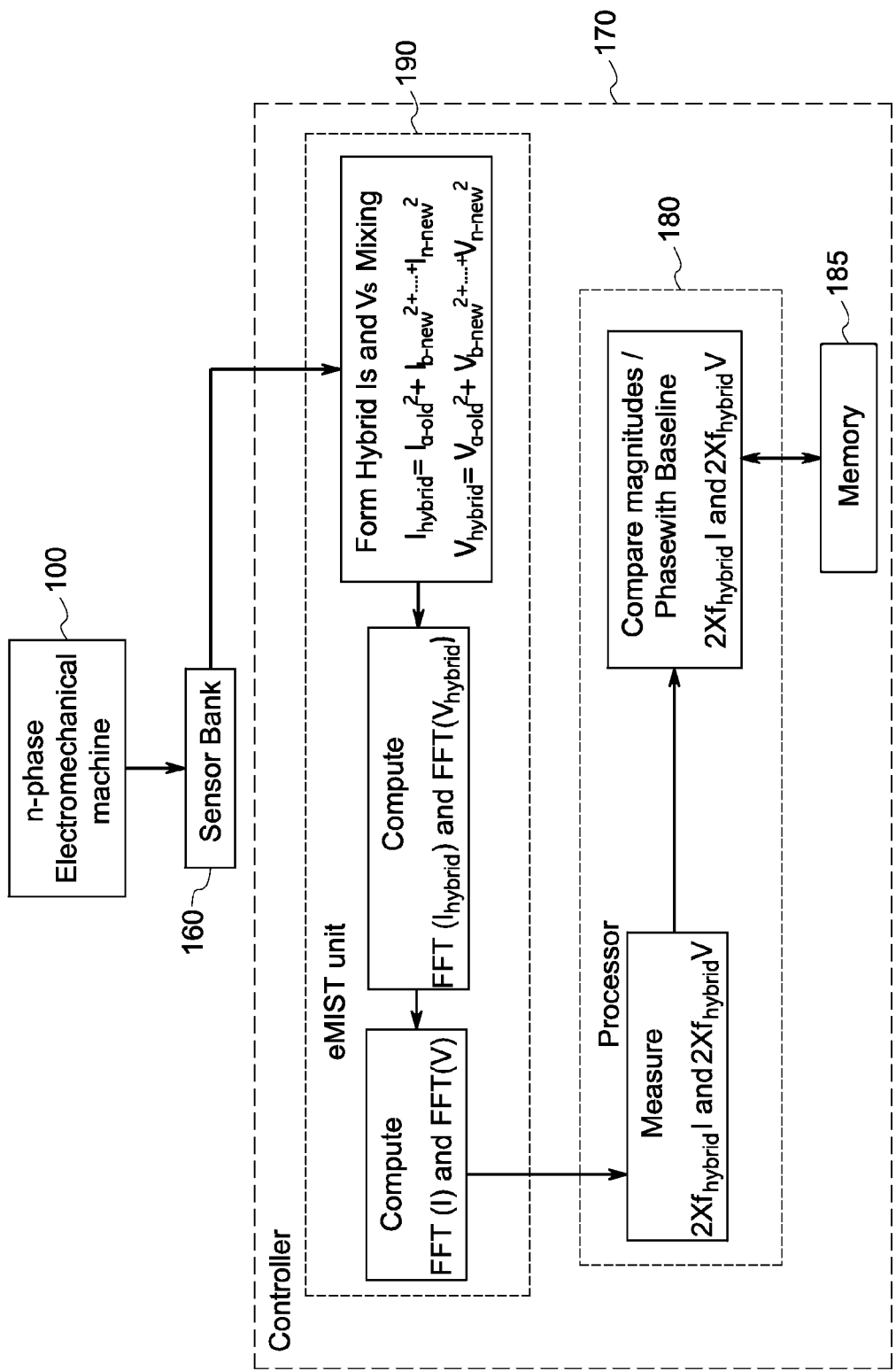
FIG. 5 is a block diagram representation of an exemplary fault detection system configuration in accordance with one embodiment.

It should be noted that the mechanical faults related to the EMM assembly 100 may also include faults in the rotor assembly 110. In the case of faults occurring in the rotor assembly 100, a measurement of stator current will not help detect a fault associated with the rotor since any fault occurring in the rotor will create equal modulation in all the n-phases of the multi-phase generator, with 'n' being the number of phases. In order to detect faults in the rotor assembly, the eMIST unit 190 is configured to compute baseline measurements as illustrated in FIG. 4, and then calculate a "hybrid" stator current data, as illustrated in FIG. 5. The baseline measurements of stator current and voltage data are the current and voltage data associated with healthy drive-train and bearing components and acquired during non-faulty operating conditions of the EMM assembly 100. The baseline stator current data associated with healthy drive-train and bearing conditions may include a set of stator current data for each of the multiple phases that are acquired, shortly after the installation of the EMM assembly 100 including the bearing and drive-train components. In an example, the baseline stator electrical signals are acquired during the initial operation of the EMM assembly 100, i.e., the first time the EMM assembly 100 is run after the EMM assembly 100 is installed. The stator current data thus acquired ensures that no drive-train or bearing fault related component is included in the stator current. Referring to FIG. 4, in an example, the eMIST unit 190 receives the current and voltage data from the bank of sensors 160 and computes the baseline measurements for current and voltage according to equations (3) and (4) below, $$I\text{baseline} = Ia\text{-baseline}^2 + Ib\text{-baseline}^2 + \ldots + In\text{-baseline}^2 \quad (3)$$

$$V\text{baseline} = Va\text{-baseline}^2 + Vb\text{-baseline}^2 + \ldots + Vn\text{-baseline}^2 \quad (4)$$

Where,
Ibaseline, is the baseline stator current data measured during healthy machine conditions
Ia-baseline is the baseline stator current data for the first phase
Ib-baseline is the baseline stator current data for the second phase
In-baseline is the baseline stator current data for the nth phase
Vbaseline is the baseline stator voltage data measured during healthy machine conditions
Va-baseline is the baseline stator voltage data for the first phase
Vb-baseline is the baseline stator voltage data for the second phase
Vn-baseline is the baseline stator voltage data for the nth phase.

Thus, the baseline current (I) and voltage (V) data is a sum of the squares of the instantaneous values of current and voltage signal of each of the multiple phases. The eMIST unit 190 is further configured to perform a Fast Fourier Transform (FFT) on the baseline stator current and voltage values, according to equations (5) and (6) in order to decompose the non-fault related components in the current signal (I) into an equivalent DC quantity while rendering the fault related components in the AC spectrum at twice the frequency in the frequency domain. Since all the components in the stator current at a healthy bearing condition are noise, no fault information is embedded in the AC spectrum during baseline measurements. Therefore, when the fault develops, only the noise components show up in the AC spectrum at twice frequency.

$$FFT(I) = 2*f\text{baseline}I \quad (5)$$

$$FFT(V) = 2*f\text{baseline}V \quad (6)$$

In an ideal situation, assuming that the EMM assembly 100 is operating normally with no mechanical faults, the resulting stator current and voltage data will have the non-fault related components, i.e., the balanced components eliminated and with no fault-related components in the AC spectrum. The resulting stator current and voltage data will form the baseline data during fault detection. The processor 180 may store the baseline measurements in a memory 185 for use during rotor 110 fault analysis and detection.

Further, referring to FIG. 5, the eMIST unit 190 receives the current and voltage data from the bank of sensors 160 and computes the hybrid stator current data for current and voltage according to equations (7) and (8) as shown below. The hybrid stator current and voltage data are computed by replacing the current and voltage component of at least one phase of the multi-phase current and voltage data with a corresponding baseline current and voltage data for that particular phase, where the baseline data is measured during normal/healthy machine conditions.

$$I\text{hybrid} = Ia\text{-old}^2 + Ib\text{-new}^2 + \ldots + In\text{-new}^2 \quad (7)$$

$$V\text{hybrid} = Va\text{-old}^2 + Vb\text{-new}^2 + \ldots + Vn\text{-new}^2 \quad (8)$$

Where,
Ihybrid, is the stator current data acquired during fault detection
Ia-old, is the current data of the first phase acquired during baseline measurement
Ib-new, is the current data of the second phase acquired during fault detection
In-new, is the current data of the nth phase acquired during fault detection Vhybrid, is the stator voltage data acquired during fault detection Va-old, is the voltage data of the first phase acquired during baseline measurement Vb-new, is the voltage data of the second phase acquired during fault detection Vn-new, is the voltage data of the nth phase acquired during fault detection.

The eMIST unit 190 is further configured to perform a Fast Fourier Transform (FFT) on the hybrid stator current and voltage values, according to equations (9) and (10) in order to decompose the non-fault related components in the current signal (I) into an equivalent DC quantity while rendering the fault related components in the AC spectrum at twice the frequency in the frequency domain.

$$FFT(Ihybrid) = 2 * fhybrid I \quad (9)$$

$$FFT(Vhybrid) = 2 * fhybrid V \quad (10)$$

The processor 180 may then compare the magnitudes and phases of the hybrid AC quantities for the voltage and current with the baseline measurements for voltage and current. Based on the comparison, any deviation of the hybrid quantities from the baseline measurements may indicate a fault in at least one of the components in the EMM assembly 100, such as a drive-train component or a bearing. The results of the comparison may be stored in memory 185 for further analysis such as the frequency of faults, the time of occurrence of faults, frequency of failure of particular components, etc.

In addition, to improve the detection accuracy it is desired to obtain a set of thresholds for each component under monitoring, including gearbox 140 and bearing 120 of the EMM assembly 100. In order to differentiate between various faults occurring in the various components within the EMM assembly 100, multiple samples of the current and voltage signals under baseline condition and fault detection condition are collected for each component and corresponding thresholds are set. For example, to differentiate a deteriorated gearbox condition from other faulty components, it is desired to have a warning threshold for the RMS of the noise-cancelled stator current for the gearbox 140. A possible gearbox fault can be detected by observing uncontrolled variation in the noise-cancelled stator current from the determined warning threshold. To avoid misjudgment due to insufficient data, the processor 180 starts after receiving enough samples of the noise-cancelled stator current, for example, after receiving over 30-50 samples. The variation may be measured by the percentage of out-of-control samples, e.g., over 10%, outside the control limits, a warning message about the gearbox condition will be sent.

Figure 6:
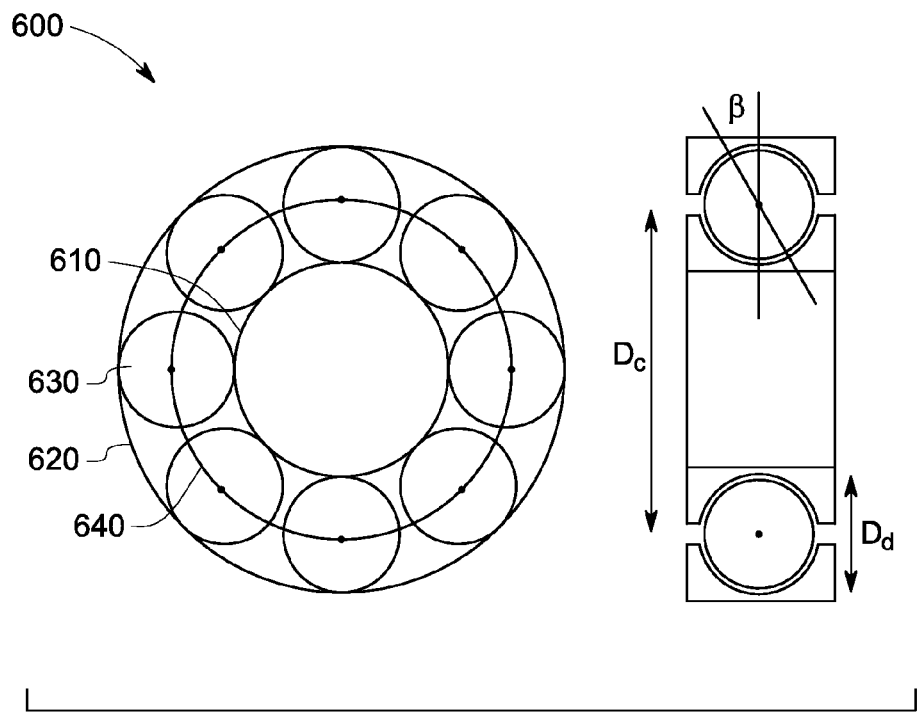
FIG. 6 is a schematic representation of a configuration of a bearing of the EMM in accordance with one embodiment.

FIG. 6 shows a schematic representation of a bearing 600 having an inner raceway 610 and an outer raceway 620 with bearing balls 630 between the inner and outer raceway 610, 620, and a cage 640 to secure the balls 630 in their position within the bearing 600. The outer and inner raceway frequencies are produced when each ball 630 passes over a defect. This occurs Nb times during a complete circuit of the raceway, where Nb is the number of balls 630 in the bearing 600. This causes the bearing frequency fbearing to be defined according to equations (11)-(13), fbearing:

$$\text{Outer raceway: } f_0 = \frac{N_b}{2} f_r \left(1 - \frac{D_b}{D_c} \cos \beta \right) \quad (11)$$

$$\text{Inner raceway: } f_i = \frac{N_b}{2} f_r \left(1 + \frac{D_b}{D_c} \cos \beta \right) \quad (12)$$

$$\text{Ball: } f_b = \frac{D_c}{D_b} f_r \left(1 - \frac{D_b^2}{D_c^2} \cos^2 \beta \right). \quad (13)$$

Where,
f0 is the vibration frequency of the outer raceway 620
fi is the vibration frequency of the inner raceway 620
fb is the vibration frequency of the bearing ball 630
Nb is the no. of balls 630
fr is the mechanical rotor speed in Hz
Db is the ball diameter
Dc is the bearing pitch diameter
β is the contact angle of the balls on the races Such bearing vibrations also show up in the electrical current spectrum of the generator 150 due to the air-gap modulation resulting from the vibrations. Specific frequencies in the stator current spectrum can be related to specific failure modes in the bearings 600 and gearbox 140 components. According to the equation (14),
Stator current frequency:

$$fs = |f\text{fundamental} \pm k \cdot f\text{bearing}| \quad (14)$$

Where,
ffundamental=60 Hz

In an example, for detecting a bearing inner raceway 610 fault for a given sample test condition of a shaft speed of 800 rpm, load of 15 KW, rotor excitation frequency of 20 Hz and stator output frequency of 60 Hz, the bearing vibration frequency according to equation (12) is calculated as, $$f_{bearing} = \frac{N_b}{2} f_{rotor} \left(1 + \frac{D_b}{D_c} \cos \beta \right) \approx 66 \sim 67 \text{ Hz}$$

Where,
$N_b = 8$
$f_{rotor} = 800/60 = 13.3$ Hz
$D_b = 2.3$ cm
$D_c = 9.3$ cm
$\beta \approx 0$ The stator current frequency according to equation (14) is given by, $$f_{bearing} = \frac{N_b}{2} f_{rotor} \left(1 + \frac{D_b}{D_c} \cos \beta \right) \approx 66 \sim 67 \text{ Hz}$$

$$f_s = |f_{fundamental} \pm k \cdot f_{bearing}|$$

$$f_s = |f_{fundamental} - 2 \cdot f_{bearing}| \approx 73.1 \text{ Hz}$$

Where,
ffundamental=stator output frequency of 60 Hz
Constant k=2

Figure 7:
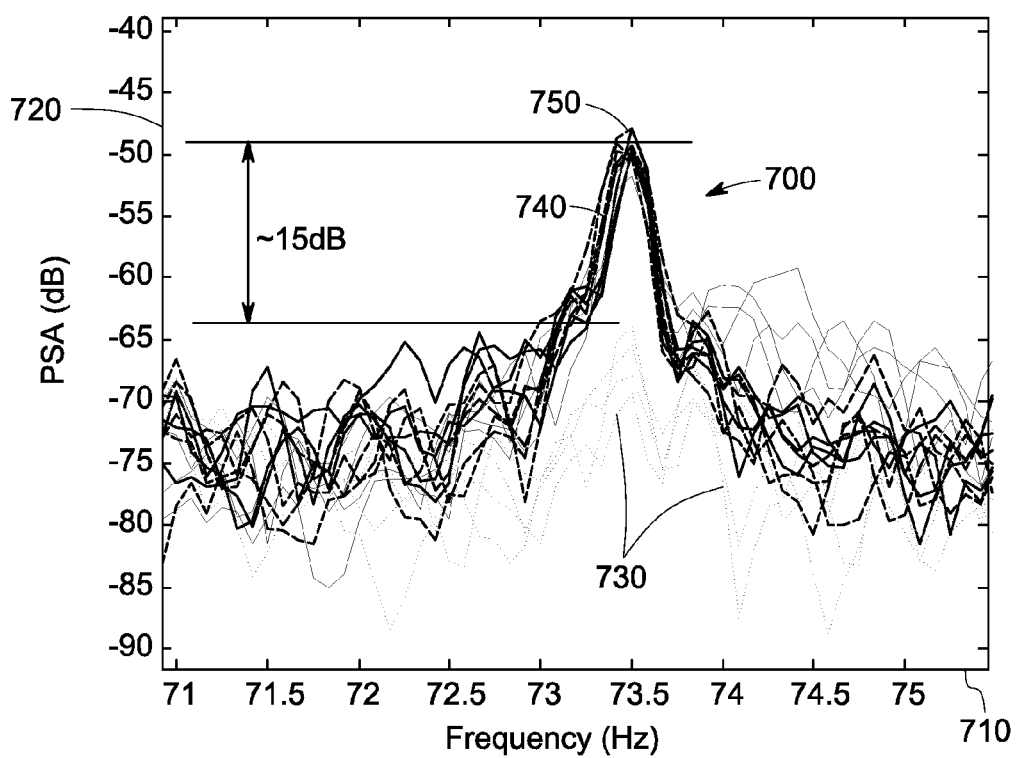
FIG. 7 is a schematic representation of an exemplary waveform of stator output current of the EMM in FIG. 1 in frequency domain in accordance with an embodiment of the invention.

A waveform of a sample stator output current in the frequency domain is shown in FIG. 7. The x-axis 710 represents frequency in Hz and the y-axis 720 represents gain in dB. Curve 730 represents a stator output current under normal bearing conditions while curve 740 represents a stator output current under a faulty bearing condition having a faulty inner bearing raceway. The peak stator output current due to the bearing fault is shown by curve 750. As shown by example, the difference in the stator output current for a healthy bearing condition and a faulty bearing condition is about 15 dB.

Figure 8:
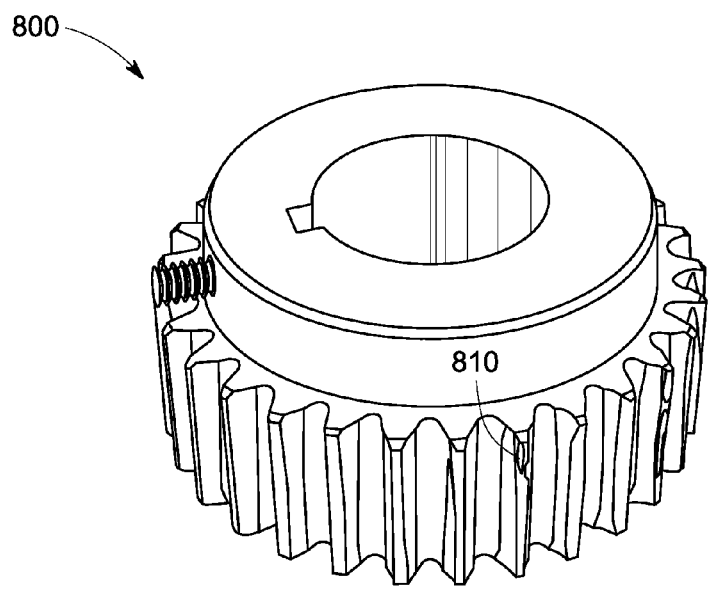
FIG. 8 is a schematic representation of a configuration of a gearbox pinion of the EMM in accordance with one embodiment.

FIG. 8 shows a schematic representation of a gearbox pinion having worn teeth 810. For a given sample test condition of a shaft speed of 800 rpm, load of 15 KW, rotor excitation frequency of 20 Hz and stator output frequency of 60 Hz, the stator current frequency under a faulty gearbox pinion 800 is calculated according to equation (12) as, $$f_s = |f_{fundamental} \pm k \cdot f_{rotor}|$$
$$f_s = |f_{fundamental} - 56 \cdot f_{rotor}| \approx 833 \text{ Hz}$$

Where,
$f_{rotor}$=800/60=13.3 Hz
ffundamental=60 Hz
Constant k=56

The constant k determines the bandwidth for monitoring the waveform. Accordingly, the constant k can be determined in order to select a bandwidth within which the frequency represented by the waveform is most sensitive for fault analysis and detection.

Figure 9:
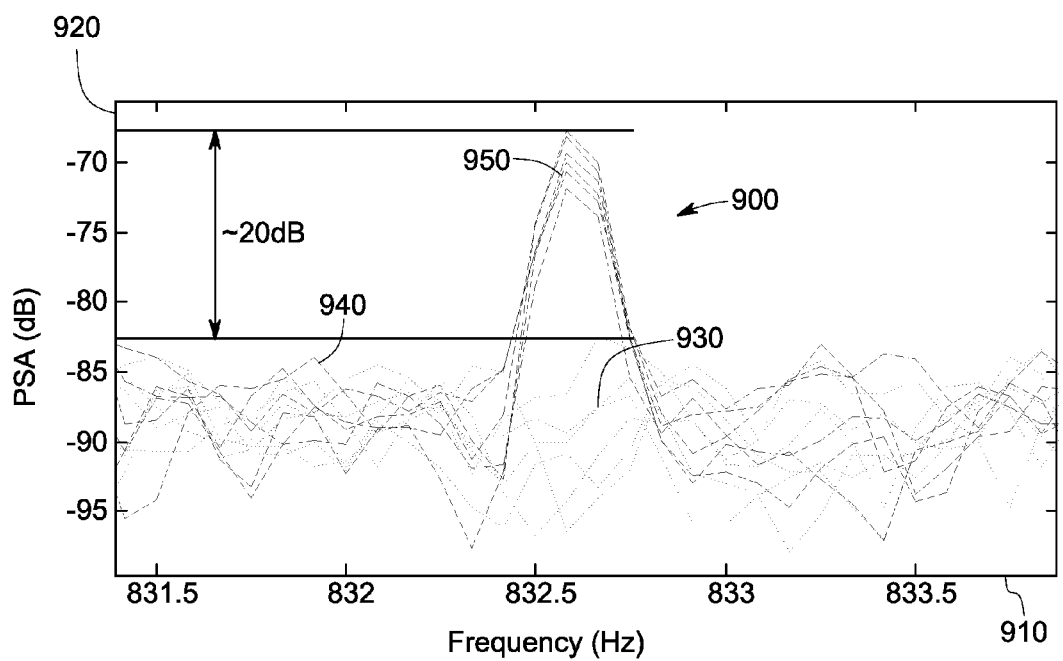
FIG. 9 is a schematic representation of an exemplary waveform of stator output current of the EMM in FIG. 1 in frequency domain in accordance with an embodiment of the invention.

A waveform 900 of a sample stator output current in the frequency domain for a faulty gearbox is shown in FIG. 9. The x-axis 910 represents frequency in Hz and the y-axis 920 represents gain in dB. Curve 930 represents a stator output current under healthy gearbox conditions while curve 940 represents a stator output current under a faulty gearbox condition having a faulty pinion. The peak stator output current due to the gearbox fault is shown by curve 950. As shown by example, the difference in the stator output current for a healthy gearbox condition and a faulty gearbox condition is about 20 dB.

In one embodiment, the present invention is applied to a Doubly Fed Induction Generator (DFIG), where any mechanical fault relating to the generator bearing or gearbox is detected by analyzing electrical signals such as voltage and current output at the stator of the DFIG. In an example, the DFIG is a part of a wind turbine assembly where the blades of the wind turbine comprise the rotor assembly for the DFIG. The method includes acquiring stator output signals, for example, stator output current signals using one or more sensors. The one or more sensors may be condition based monitoring (CBM) sensors. The approach consists of monitoring spectral contents in the DFIG stator current and relating the spectral signature of the stator current to faults in the DFIG bearings and gearbox. The faults in the bearings and gearbox generate vibrations in the shaft of the DFIG which in-turn propagate as torque oscillations at the rotor mechanical rotating frequency in the DFIG. These vibrations also show up in the electrical current spectrum of the generator due to the air-gap modulation resulting from the oscillations. Therefore, specific frequencies in the stator output current of the DFIG can be related to specific failure modes in the bearings and drive-train components. Although, the present embodiment is described with respect to a DFIG in a wind turbine, the present embodiment can be applied to other electromechanical machines and other systems.

Figure 10:
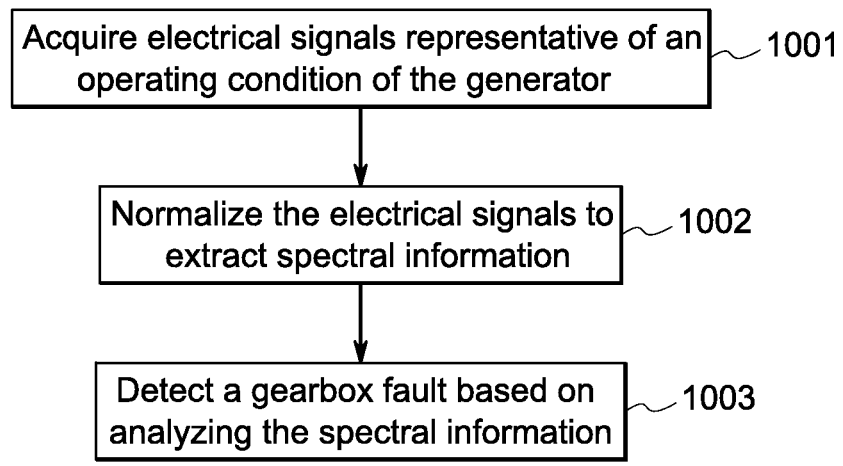
FIG. 10 is a flow chart representing steps involved in an exemplary method of detecting faults in a wind turbine generator.

FIG. 10 is a flowchart representing steps involved in an exemplary method of detecting faults in a wind turbine generator. In step 1001, electrical signals representative of an operating condition of a generator is acquired. In an example, the electrical signals are current signals that correspond to an operating condition of the generator such as a faulty operating condition. Further, in step 1002 the electrical signals are processed based on Fast Fourier Transforms, time frequency analysis, or multimodal resolution analysis, or combinations thereof to provide a normalized spectrum of electrical signals. In step 1003, the normalized spectral information is provided to the processor for feature extraction and for performing spectral reinforcement based conclusions. In step 1003, a fault related to a gearbox or bearing or any other component associated with the generator is detected when the current signature deviates from a determined threshold value. The threshold value for detecting a particular fault may be determined based on the generator ratings, field tests, and/or simulation results. In another embodiment, a generator fault may be detected by fusing the results of vibration signals and electrical signals.

Figure 11:
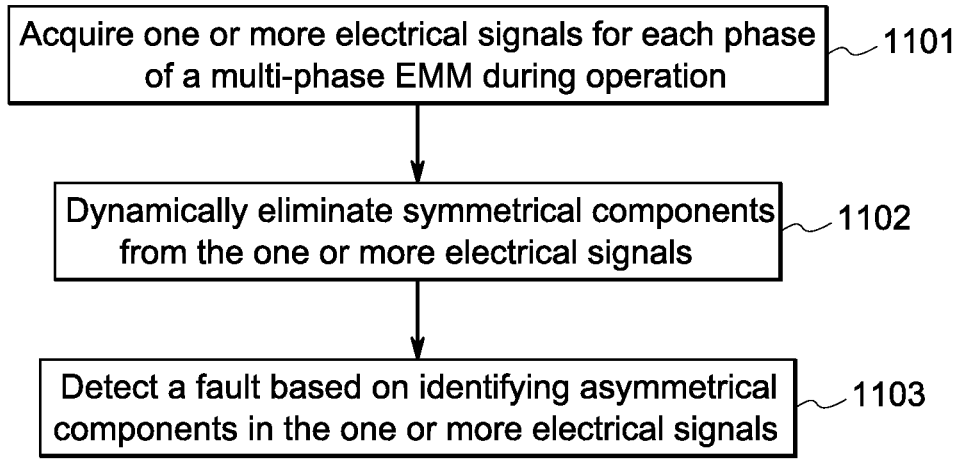
FIG. 11 is a flow chart representing steps involved in an exemplary method of detecting faults in an Electromechanical Machine (EMM) in accordance with one embodiment of the invention.

FIG. 11 is a flow chart representing steps involved in an exemplary method of detecting faults in an Electromechanical Machine (EMM) in accordance with an embodiment of the invention. The method 1100 includes acquiring one or more electrical signals for each phase of a multi-phase EMM during operation in step 1101. Examples of the electrical signals include current, voltage, power, etc. Further, the method includes dynamically eliminating symmetrical components from the one or more electrical signals in step 1102. In one embodiment, the symmetrical components are dynamically eliminated according to an algorithm shown by equations (1) and (2), in which an instantaneous value of the one or more electrical signals for each phase of the multiple phases is squared the squared values of the one or more electrical signals are summed. The resulting current and voltage values are decomposed into symmetrical components and asymmetrical components by any normalization technique such as Fast Fourier Transform (FFT). In step 1103, a fault is detected based on identifying asymmetrical components in the resulting electrical signals. In one example, the asymmetrical components in the resulting electrical signals, i.e., in the resulting AC spectrum, are compared with determined thresholds. A fault is detected when the asymmetrical components deviate from a determined threshold value.

Figure 12:
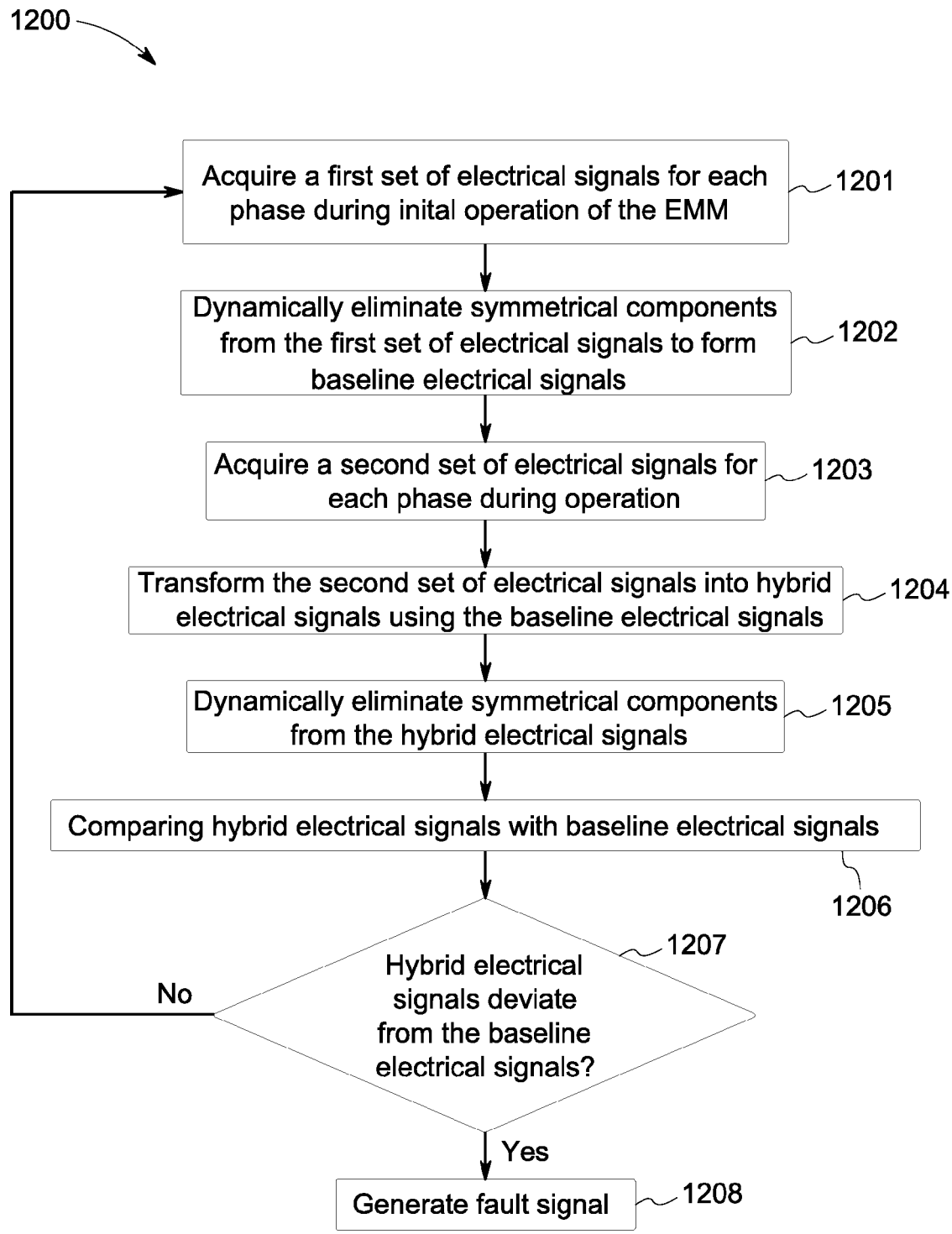
FIG. 12 is a flow chart representing steps involved in an exemplary method of detecting faults in an Electromechanical Machine (EMM) in accordance with another embodiment of the invention.

FIG. 12 is a flow chart representing steps involved in an exemplary method of detecting faults in an Electromechanical Machine (EMM) in accordance with another embodiment of the invention. The method 1200 includes acquiring a first set of electrical signals for each phase of a multi-phase EMM, during initial operation of the EMM in step 1201. In an embodiment, the first set of electrical signals is acquired during the initial operation of the EMM, i.e., the first time the EMM is run once the EMM is installed. The stator current data thus acquired ensures that no EMM component fault related signals is included in the stator current. In step 1202, the symmetrical components in the first set of electrical signals are dynamically eliminated according to an algorithm shown by equations (3)-(6), in which an instantaneous value of the first set of electrical signals for each phase of the multiple phases is squared the squared values of the one or more electrical signals are summed to form baseline electrical signals. In step 1203, a second set of electrical signals for each phase of the multi-phase EMM during normal operation of the EMM. For example, the second set of electrical signals is acquired continuously as part of a condition monitoring process in which the EMM is likely to generate signals representative of a faulty operating condition of the EMM assembly. The faulty operating condition may be a result of faulty or worn components within the EMM assembly. The second set of electrical signals is transformed into hybrid electrical signals, in step 1204.

In one embodiment, the second set of electrical signals are transformed into hybrid electrical signals by replacing the electrical signal in the first set of electrical signals acquired for at least one phase with a baseline electrical signal for a corresponding phase. Any fault occurring in the rotor fault would normally modulate the output stator electrical signals equally in all the n-phases. Accordingly, forming the hybrid electrical signals as shown by equations (7)-(8) enables detection of any fault occurring in the rotor assembly. In step 1205, the symmetrical components in the hybrid electrical signals are eliminated as shown by equations (9) and (10). The fault-related asymmetrical components, if any, in the resulting electrical signals from step 1105 appear at twice its frequency in the AC spectrum. The asymmetrical components in the hybrid electrical signals are compared with the asymmetrical components in the baseline electrical signals in step 1206. Based on the comparison, if the asymmetrical components in the hybrid electrical signals deviate from the asymmetrical components in the baseline electrical signals in step 1207, a fault signals is generated in step 1208. Otherwise, the method proceeds to step 1201 and continues monitoring the stator output signals for fault.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for detecting mechanical faults in an electromechanical machine having multiple electrical phases, the method comprising:
    acquiring electrical signals for each phase of the multiple electrical phases from one or more sensors representative of an operating condition of the electromechanical machine;
    normalizing the electrical signals to extract spectral information; and
    detecting a fault based on analysis of the spectral information comprising
        decomposing electrically balanced, non-fault related components of the multiple electrical phases into a DC quantity and electrically unbalanced, fault related components of the multiple electrical phases into an AC quantity to eliminate balanced components from the spectral information and extract unbalanced components that appear in the spectral information during abnormal operating conditions.

2. The method of claim 1, wherein detecting a fault based on analyzing the spectral information comprises detecting a bearing fault or a gearbox fault.

3. The method of claim 1, wherein the electrical signals representative of an operating condition of the electromechanical machine comprises current and voltage signals.

4. The method of claim 1, wherein a current spectrum of the electromechanical machine is normalized based on at least one of Fast Fourier Transform, time frequency analysis, and multimodal resolution analysis.

5. The method of claim 1, wherein eliminating balanced components from the spectral information comprises eliminating symmetrical components that compose an electromechanical machine current spectrum during a normal operating condition of the electromechanical machine.

6. The method of claim 1, wherein detecting a fault based on analyzing the spectral information comprises detecting a fault in a drive-train.

7. The method of claim 1, wherein detecting a fault further comprises:
    squaring instantaneous values of the electrical signals for each of the multiple phases; and
    summing the squared instantaneous values to transform the electrically balanced components into the DC quantity and any electrically unbalanced, fault-related components into the AC quantity to enhance detection sensitivity.

8. A method for detecting mechanical faults in an electromechanical machine, the method comprising:
    acquiring electrical signals from one or more sensors representative of an operating condition of the electromechanical machine;
    normalizing the electrical signals to extract spectral information;
    analyzing the spectral information to form baseline electrical signals, wherein analyzing comprises
        eliminating balanced components from the spectral information, and
        extracting unbalanced components that appear in the spectral information of the electromechanical machine during abnormal operating conditions;
    acquiring a second set of electrical signals representative of a non-faulty operating condition of the electromechanical machine;
    transforming the electrical signals representative of the operating condition of the electromechanical machine into hybrid electrical signals using the second set of electrical signals;
    normalizing the hybrid electrical signals to extract spectral information; and
    detecting a fault if the hybrid electrical signals deviate from the baseline electrical signals.

9. The method of claim 8, wherein acquiring a second set of electrical signals representative of a non-faulty operating condition of the electromechanical machine comprises acquiring a second set of electrical signals for each phase of multiple phases of the electromechanical machine.

10. The method of claim 8, wherein normalizing the hybrid electrical signals to extract spectral information comprises:
    dynamically eliminating symmetrical components from the hybrid electrical signals;
    comparing a magnitude and phase of the asymmetrical components in the hybrid electrical signals with a magnitude and phase of the second set of electrical signals; and
    detecting a fault when the asymmetrical components in the hybrid electrical signals deviate from the magnitude and phase of the second set of electrical signals.

11. The method of claim 10, wherein detecting a fault comprises detecting a fault in a rotor of the electromechanical machine.

12. The method of claim 1 wherein analyzing the extracted feature comprises comparing an extracted feature with a determined threshold value.

13. A system for detecting a fault of an electromechanical machine having multiple electrical phases, the system comprising:
    one or more sensors for acquiring electrical signals for each phase of the multiple electrical phases representative of an operating condition of the electromechanical machine;
    a controller coupled to the one or more sensors to detect a fault in the electromechanical machine, the controller configured to
    normalize the electrical signals to extract spectral information; and
    analyze the spectral information by decomposing electrically balanced, non-fault related components into a DC quantity and electrically unbalanced, fault related components into an AC quantity.

14. The system of claim 13, wherein said controller detects a bearing fault or a gearbox fault.

15. The system of claim 13, wherein said one or more sensors acquire electrical signals for each phase of the multiple phases of the electromechanical machine.

16. The system of claim 13, wherein the electromechanical machine comprises a drive-train.

17. The system of claim 13, wherein the electromechanical machine comprises a generator.

18. The method of claim 13, wherein the controller is further configured to
- square instantaneous values of the electrical signals for each of the multiple phases; and
- sum the squared instantaneous values to transform the electrically balanced components into the DC quantity and any electrically unbalanced, fault-related components into the AC quantity to enhance detection sensitivity.

* * * * *

UNITED STATES PATENT AND TRADEMARK OFFICE
CERTIFICATE OF CORRECTION

PATENT NO. : 8,994,359 B2
APPLICATION NO. : 13/219753
DATED : March 31, 2015
INVENTOR(S) : Neti et al.

Page 1 of 1

It is certified that error appears in the above-identified patent and that said Letters Patent is hereby corrected as shown below:

In the specification
In Column 5, Lines 66-67, in Equation (4),
delete "$V\text{baseline}=Va\text{-baseline}^2+Vb\text{-baseline}^2+\ldots+Vn\text{-baseline}$" and
insert -- $V\text{baseline}=Va\text{-baseline}^2+Vb\text{-baseline}^2+\ldots+Vn\text{-baseline}^2$ --, therefor.

In the claims
In Column 13, Line 12, in Claim 18, delete "The method of" and
insert -- The system of --, therefor.

Signed and Sealed this
Thirteenth Day of October, 2015

Michelle K. Lee
*Director of the United States Patent and Trademark Office*